United States Patent
Loermans et al.

(10) Patent No.: US 7,501,048 B2
(45) Date of Patent: Mar. 10, 2009

(54) METHOD AND DEVICE FOR ELECTROLYTICALLY INCREASING THE THICKNESS OF AN ELECTRICALLY CONDUCTIVE PATTERN ON A DIELECTRIC SUBSTRATE, AS WELL AS A DIELECTRIC SUBSTRATE

(75) Inventors: Peter Jacobus Gerardus Loermans, Bergharen (NL); Augustinus Cornelis Maria Van De Ven, Westerhoven (NL)

(73) Assignee: Meco Equipment Engineers B.V., Drunen (NL)

( * ) Notice: Subject to any disclaimer, the term of this patent is extended or adjusted under 35 U.S.C. 154(b) by 546 days.

(21) Appl. No.: 11/052,035

(22) Filed: Feb. 8, 2005

(65) Prior Publication Data

US 2005/0189226 A1  Sep. 1, 2005

(30) Foreign Application Priority Data

Feb. 9, 2004  (NL)  .................................. 1025446

(51) Int. Cl.
*C23D 11/18* (2006.01)
(52) U.S. Cl. ...................................... 204/202; 204/199
(58) Field of Classification Search ................. 204/199, 204/202, 206; 205/129, 138; 118/400, 423, 118/426
See application file for complete search history.

(56) References Cited

U.S. PATENT DOCUMENTS 1,513,696 A * 10/1924 Demel ......................... 204/210
3,668,079 A * 6/1972 Diamond et al. ............... 205/56
4,581,260 A * 4/1986 Mawla .................... 427/443.1
5,951,763 A * 9/1999 Knox .......................... 118/409

FOREIGN PATENT DOCUMENTS

| DE | 100 65 643 A 1 | 7/2000 |
| FR | 2 847 761 | 5/2004 |
| JP | 2-33995 | 2/1990 |
| WO | WO 02053807 A1 * | 7/2002 |
| WO | WO 03/038158 A2 | 5/2003 |

* cited by examiner

*Primary Examiner*—Nam X Nguyen
*Assistant Examiner*—Luan V Van
(74) *Attorney, Agent, or Firm*—Oblon, Spivak, McClelland, Maier & Neustadt, P.C.

(57) ABSTRACT

The invention provides a method for electrolytically increasing the thickness of an electrically conductive pattern on a dielectric substrate, comprising the steps of
  immersing the substrate with the pattern present thereon in an electrolytic bath,
  electrically contacting in the electrolytic bath a negatively charged electrode with the pattern during immersion of the substrate, and
  effecting contacting movement in the electrolytic bath of the electrode and the pattern with respect to each other during immersion of the substrate.

The invention furthermore provides a device for electrolytically increasing the thickness of an electrically conductive pattern on a dielectric substrate.

18 Claims, 5 Drawing Sheets

METHOD AND DEVICE FOR ELECTROLYTICALLY INCREASING THE THICKNESS OF AN ELECTRICALLY CONDUCTIVE PATTERN ON A DIELECTRIC SUBSTRATE, AS WELL AS A DIELECTRIC SUBSTRATE

The present invention relates to a method and a device for electrolytically increasing the thickness of an electrically conductive pattern on a dielectric substrate. More specifically, the method according to the invention comprises the steps of immersing the substrate with the pattern present thereon in an electrolytic bath, electrically contacting in the electrolytic bath a negatively charged electrode with the pattern during immersion of the substrate.

The device according to the invention more specifically comprises a container for an electrolytic bath, first positioning means for positioning the substrate with the pattern present thereon in the bath, a negatively charged electrode for electrically conducting contact with the pattern, and second positioning means for positioning the electrode in such a manner that the electrode is in conducting contact in the bath with the pattern. Such a method and device are known from German patent application DE-A1-10065643.

Creating an electrically conductive pattern on a dielectric substrate is in particular necessary in the production of various components for the electronic industry. Examples of such components are so-called RFID labels, flexible electronic circuits, flexible cable harnesses, electro-fluorescent displays and flexible solar panels.

It is already known to employ a gravure printing method for creating an electrically conductive pattern on a dielectric substrate. Thus, an electrically conductive ink is applied to an electrically nonconductive substrate according to a particular pattern, and immediately after said application the pattern is coated with an electrically conductive material, using different techniques, for example an electroplating process, so as to increase the thickness of the electrically conductive pattern. The substrate is formed by a foil, which is transported from a drum to a gravure printing machine and subsequently to a coating machine. In those cases in which an electrolytical process is used for said coating of the printed pattern, it is suggested in International patent application WO 02/096168 A2 to use copper in an electrolytic bath for that purpose, which is claimed to provide layer thicknesses of 2 μm or more.

An important drawback of the method and the device as described in WO 02/096168 A2 is the fact that the use of the printing fluid containing electrically conductive particles involves the risk that initially a continuous conductive pattern of electrically conductive particles is not obtained during the gravure printing process, so that local interruptions are formed, as a consequence of which the use of the electrolytical process is no longer readily possible. In addition to that it applies that precisely when the electrically conductive pattern to be formed has a relatively great length, for example in the case of a planar antenna of an RFID label, only the first part of such a project is plated, because the electrons, on account of the relatively high electrical resistance, will only migrate through the first part of the length, where they will combine with a positively charged ion into a particle that precipitates on the pattern. In addition to that, the layer thicknesses that can be achieved are comparatively limited. More specifically, layer thicknesses of 10 or 20 μm, for example, cannot be realised on a large scale in an industrially sound manner. In some cases, however, such great layer thicknesses are required in view of the specific use of a particular component. Think in this connection of RFID labels, which are intended to intercept and transmit radio signals within a range of a few dozen metres. Another drawback is the fact that it is necessary to use not only of the final electrically conductive pattern itself, but also auxiliary electrical tracks connected to the patterns, so as to make it possible for the final electrically conductive patterns to function as a cathode during the electrolytical process. Said auxiliary electrical tracks, as well as any material that may have precipitated thereon, are eventually removed, for example by subjecting the substrate to a punching operation. This leads to a loss of raw materials.

International patent application WO 02/099163 A2 discloses a so-called autocatalytic coating method wherein first a palladium containing solution is sprayed on a dielectric substrate, after which the substrate is placed in an autocatalytic deposition solution for electroless deposition of electrically conductive particles on the palladium precursors. An important drawback of such a method is the fact that it is not suitable for large-scale industrial use on account of the limited deposition rate.

German patent application DE-A1-10065643 describes a device and a method for electrochemically treating a flexible band-shaped, non-conductive substrate with a conductive layer present thereon. The substrate is passed over a rotating drum, which is fully submerged in an electrolytic bath and which is alternately provided on its outer circumference with strip-shaped electrodes and counter electrodes extending at least substantially parallel to the central axis of the drum. The electrodes are insulated along their circumference, with the exception of the part that makes contact with the conductive layer, and they extend farther in radial direction than the counter electrodes, as a result of which small electrolytic cells have formed between adjacent electrodes, the counter electrode present therebetween and the substrate, wherein the counter electrode functions as an anode and wherein metal ions precipitate on the conductive layer, thus causing the thickness thereof to increase. This has a number of drawbacks. An important drawback is the phenomenon that no increase of the layer thickness can take place at the positions where the conductive layer and the electrode are in contact with each other. This drawback is recognised in DE-A1-10065643, but the solutions proposed therein do not lead to satisfactory results. Thus it is proposed to make use of a number of drums arranged in succession, of non-parallel (counter) electrodes and/or of (counter) electrodes of mutually different dimensions. The main drawback of such alleged solutions is the fact that the increase of the layer thickness takes place in an irregular manner. In addition to that, such solutions usually make it necessary to use a number of drums, whilst the risk of a reduced or altogether absent increase of the layer thickness of particular parts of the conductive layer remains. Another important drawback of the device and the method as described in DE-A1-10065643 is the fact that as soon as there is no contact between the substrate and an the electrode, metal ions will precipitate on the electrodes in question and thus contaminate said electrodes.

The object of the invention is to provide a device and a method as referred to in the introduction, which make it possible to realise large-scale deposition of electrically conductive patterns on dielectric substrates, in relatively great layer thicknesses, if desired, and with a minimum use of raw materials, in an industrially sound manner. More specifically, the object of the invention is in the first place to have the increase of the thickness of the electrically conductive pattern take place in a homogeneous manner. To that end, the method according to the invention comprises the step of effecting contacting movement in the electrolytic bath of the electrode and the pattern with respect to each other during immersion of the substrate. On the one hand, the presence of electrically conductive auxiliary tracks on said electrical substrate is in principle not required when using the method according to the invention, since the contact between the negatively charged electrode and the pattern is effected in the liquid of the electrolytic bath, and that the electrical resistance of the pattern, which may be relatively high, does not necessarily imply that only a first part of the pattern is electroplated, and that consequently the thickness of the electrically conductive pattern increases only at that location, because the contact can take place at any desired position of the pattern, and possibly at several positions simultaneously. On the other hand, it very specifically applies in the case of the present invention that it is possible to prevent a situation in which no electrolytic growth on part of the pattern takes place, because of the contact that occurs between the electrode and the pattern, and that thus a homogeneous layer thickness distribution and a uniform growth of the layer thickness can be obtained.

Preferably, the speed at which the electrode and the pattern move with respect to each other is such that at least one repetitive part of the pattern is passed by the electrode during the electrical contact between the electrode and the pattern. The optimum relative speed will thus depend (in part) on the shape and the dimension of the electrically conductive pattern. The present preferred embodiment achieves that at least one fully repetitive part of the pattern is subjected to the action of the negatively charged electrode, which (relatively) moves past the pattern, in (relative) contact therewith, upon immersion of the substrate in the electrolytic bath. In the case of an RFID label, such a repetitive part of a pattern is typically formed by the spiral-shaped antenna. In general, the relative speed between the electrodes and pattern will preferably range between 1 and 50 mm/sec, more preferably between 3 and 12 mm/sec, even if there is no question of a repetitive part of the pattern. An overly high relative speed might lead to liquid from the electrolytic bath finding its way between the electrodes and the pattern, which will have an adverse effect on the contact and thus on the rate at which the thickness of the electrically conductive pattern will increase.

A very advantageous form of the contacting movement of the electrode and the pattern with respect to each other is obtained if the electrode rolls over the pattern. This rules out or at least significantly reduces the risk of the negatively charged electrode scraping or pushing pattern material off the substrate during said relative movement.

Precisely from the viewpoint of industrial applicability it is very strongly preferred for the substrate with the pattern present thereon to move through the bath according to a path of movement during the contact movement of the electrode and the pattern with respect to each other. Thus an important precondition, viz. that it must be possible to use the method according to the invention on a large scale in an economically optimally advantageous manner, is met.

Preferably, the electrode moves according to at least part of the path of movement during the contacting movement of the electrodes and the pattern with respect to each other. Thus the electrode can move along with the pattern, which likewise moves through the bath, so that the relative speed between the electrode and the pattern can remain within bounds.

A satisfactory compromise between the process requirements made of the method according to the invention on the one hand and the economic requirements on the other hand is achieved if the substrate moves through the bath at a speed ranging between 0.5 and 20 m/min, more preferably between 1.5 and 6 m/min. The final optimum speed will strongly depend on the capacity requirement. It is noted in this connection that the capacity can be increased not only by using a large electrolytic bath, but also by using a number of electrolytic baths arranged in succession.

Preferably, the path of movement is at least partially arcuate, so that the movement of the substrate through the bath can be effected by means of a rotating drum.

Preferably, the electrode furthermore moves according to a fixed, endless further path of movement with respect to the electrolytic bath. Said further path of movement preferably coincides over at least a part thereof with the path of movement of the substrate through the bath, or extends at least partially parallel thereto. In addition to that, it is not necessary for said further path of movement to extend fully within the electrolytic bath. As will become apparent hereinafter, it is even advantageous if said further path of movement extends partly above the electrolytic bath. The use of said further path of movement for the electrodes in particular enables production on an industrial scale, wherein a difference in the speed of movement between the electrode and the pattern during contact between the two may be applied and which difference in the speed may be adjusted by individually adjusting the speed with which the band moves according to the path of movement and the speed with which the electrode moves according to said further path of movement.

Furthermore preferably, said further path of movement is circular, since a path of movement thus configured can be realised by using relatively simple mechanic means.

In particular in order to prevent the growth of metal ions on the electrode, it is strongly preferable for said further path of movement to extend partly in the electrolytic bath and partly above the electrolytic bath. No metal ions will precipitate on the electrode (or at least to a significantly reduced extent) in the part of said further path of movement that extends above the electrolytic bath, not even at those positions where there is no contact between the pattern and the electrodes. This advantage also applies in those cases in which no contacting movement of the electrode and the pattern with respect to each other occurs during immersion of the substrate in the electrolytic bath. This would lead to a method for electrolytically increasing the thickness of an electrically conductive pattern on a dielectric substrate, comprising the steps of immersing the substrate with the pattern present thereon in an electrolytic bath, electrically contacting in the electrolytic bath a negatively charged electrode with the pattern during immersion of the substrate, wherein the electrode moves according to a fixed, endless further path of movement with respect to the electrolytic bath, which further path of movement extends partly in the electrolytic bath and partly above the electrolytic bath.

An important additional advantage of the use of a further path of movement that extends partly above the electrolytic bath is realised if the electrode is exchanged for another electrode while passing through the part of said further path of movement that extends above the electrolytic bath. The main advantage of such a method is the fact that the production process need not be interrupted for exchanging electrodes.

A good contact, necessary for increasing the thickness of the electrically conductive pattern on the substrate at the highest possible rate can be achieved if a higher liquid level is created in the electrolytic bath on the side of the substrate facing away from the electrode than on the side of the substrate facing towards the electrode. As a result of the difference in liquid pressure, an even force is exerted on the substrate in the direction of the electrode.

The invention is advantageous in particular if the pattern is at least partially spiral-shaped. When such a spiral shape is used, the electrode may be in conducting contact with the spiral shape at several positions simultaneously.

In addition to the aspects already referred to in the introduction, the device according to the invention furthermore comprises moving means for effecting contacting movement of the electrode and the pattern relative to each other. Such a device has the same advantages as the method according to the invention, viz. the fact that because of the contact between the negative electrode and the pattern in the bath, the pattern can be in electrically conducting contact with the negative electrode at several positions simultaneously, as a result of which a relatively high electrical resistance of the electrically conductive material of the pattern is not objectionable, in the sense that electrolytic growth is possible only on part of the pattern. In addition to that, auxiliary tracks are not needed. As a result of the contacting movement of the electrode and the pattern with respect to each other effected by the moving means, no part of the pattern needs to be in continuous contact with the electrode, as a result of which continuous contact the thickness of the pattern would locally not increase.

Preferably, the first positioning means comprise first moving means for moving the substrate with the pattern present thereon into the bath, through the bath and out of the bath according to a path of movement. In this way a continuous production process can be realised.

Furthermore preferably, the second positioning means comprise second moving means for moving the electrode at least through the bath. Thus the movement of the electrode and the pattern relative to each other can be effected in other ways than by moving the substrate with the pattern present thereon through the bath.

To utilize the time that the substrate is present in the electrolytic bath optimally, the second moving means are arranged for moving the electrode according to at least part of the path of movement.

A constructionally very advantageous embodiment is obtained if the electrode has the shape of a cylinder and is rotatable about the central axis thereof. Thus the electrode can roll over the substrate, or more specifically over the pattern that is present thereon, with the length of the cylinder furthermore making it possible for the electrode to be in contact with several positions of the pattern (or of a number of adjacent patterns) simultaneously.

Another constructionally advantageous embodiment is obtained if the first moving means comprise a circumferential element for passing the substrate with the pattern present thereon over at least part of the circumference of the circumferential element.

In that case, a number of elongated electrodes are preferably arranged along the circumference of the circumferential element, the longitudinal directions of which electrodes extend at least substantially parallel to each other, perpendicularly to the path of movement. Said elongated electrodes are capable of spanning the entire width of a band of substrate material.

The electrodes are preferably positioned on the inner side of the path of movement.

The circumferential element is preferably provided with two annular flanged edges, between which the path of movement extends. The two annular flanged edges and the substrate can jointly form a closure, so that the level of the electrolytic bath on the outer side of the substrate is higher than on the inner side of the substrate, as a result of which an inward force from the electrolytic bath urges the substrate into contact with the electrodes. This advantage also applies in situations in which the device does not comprise any moving means for effecting contacting movement of the electrode and the pattern with respect to each other. Thus, a device would be obtained for electrolytically increasing the thickness of an electrically conductive pattern on a dielectric substrate, comprising a container for an electrolytic bath, first positioning means for positioning the substrate with the pattern present thereon in the bath, a negatively charged electrode for electrically conducting contact with the pattern, and second positioning means for positioning the electrode in such a manner that the electrode is in conducting contact in the bath with the pattern, wherein said first positioning means comprise first moving means for moving the substrate with the pattern present thereon into the bath, through the bath and out of the bath according to a path of movement, and wherein said first moving means comprise a circumferential element for passing the substrate with the pattern present thereon over at least part of the circumference of the circumferential element, a number of elongated electrodes being arranged along the circumference of the circumferential element, the longitudinal directions of which electrodes extend at least substantially parallel to each other, perpendicularly to the path of movement, said circumferential element being provided with two ring-shaped flanged edges, between which said path of movement extends.

Preferably, the circumferential element is made up of a first rotary element, which is rotatable about at least one first, e.g. horizontal, axis of rotation. Thus, the first rotary element can move along with the substrate that is passed thereover, as it were. It is emphasised that in addition to having a cylindrical shape, the first rotary element may also be configured as two cylinder halves with straight sections therebetween, so that there are two axes of rotation.

The second moving means preferably comprise a second rotary element, which is rotatable about at least one second, e.g. horizontal, axis of rotation, along the circumference of which second rotary element a number of elongated electrodes are provided, the longitudinal directions of which electrodes extend at least substantially parallel to each other. As already indicated before, the elongated electrodes have the advantage that the electrodes can be in contact with several parts of an electrically conductive pattern on a substrate simultaneously.

Furthermore, in order to combine functions as much as possible, the first rotary element and the second rotary element are preferably formed by a common rotary element. In addition, synchronisation problems do not play a role in that case, whilst furthermore the first rotary element and the second rotary element take up a limited amount of space in that case.

Preferably, the electrodes have the shape of a cylinder, and the electrodes are rotatable about the respective central axes thereof with respect to the remaining part of the second rotary element. This makes it possible to realise the advantageous rolling movement of the electrode and the pattern with respect to each other as already described before.

For reasons of constructional simplicity, the first rotary element and/or the second rotary element at least substantially have the shape of a cylinder, about the central axis of which the first rotary element and/or the second rotary element are rotatable.

In order to realise a suitable ratio between the magnitude of the relative movement between the electrode and the pattern on the one hand and the absolute movement of the pattern on the other hand, transmission means are preferably provided for rotation of the electrodes about the central axes thereof on the one hand and of the second rotary element about the second axis of rotation on the other hand according to a specific transmission ratio.

In a strongly preferred embodiment, the negatively charged electrode is largely accommodated in a cavity of a screening element whilst extending outside the screening element to a limited extent. This achieves that as little anode material as possible is deposited on the electrode itself, whilst nevertheless a good contact between the electrically conductive pattern and the electrode is possible. It stands to reason that no deposition of anode material will take place at the location of this contact, either.

The invention also relates to a dielectric substrate having an electrically conductive pattern present thereon, whose thickness has been increased by means of a method according to the invention as explained in the foregoing. The invention will be explained in more detail below by means of a description of a preferred embodiment thereof, in which reference is made to the following figures:

Figure 1:
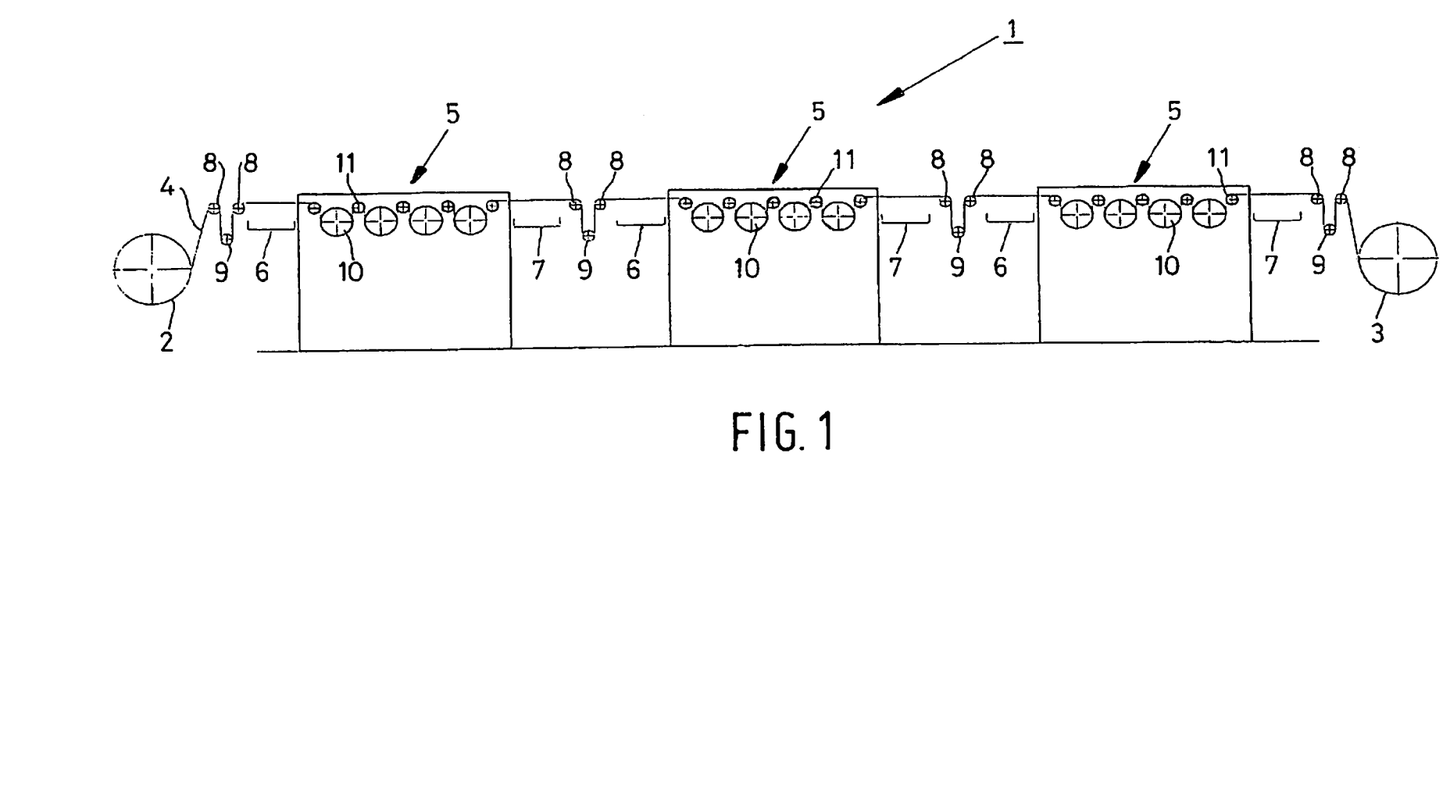
FIG. 1 is a schematic side elevation of a production line for increasing the thickness of an electrically conductive pattern on a dielectric substrate.

FIG. 1 schematically shows in side elevation a device 1 for plating an electrically conductive pattern provided on a dielectric foil substrate 4. Such a foil 4 may have been prepared in accordance with the gravure printing technology described in WO 02/096168 A2, for example, or by the autocatalytic coating method described in WO 02/099163 A2, prior to being subjected to the action of the plating device 1.

The foil 4 is unwound from the unwinding drum 2 and wound onto the winding drum 3. In the present embodiment, three plating units 5 are disposed between the unwinding drum 2 and the winding drum 3, said plating units each being provided at their front side with a pre-treatment device 6 for removing, in a manner which is known per se, an oxide film that may be present on the electrically conductive pattern on the dielectric foil substrate 4. A post-treatment device 7 is provided after each plating unit 5, which washes the foil material 4 that has been treated in the preceding plating unit 5 and which, in the case of the last plating unit 5, may apply an anti-oxidation film to the plating pattern. Roller systems each consisting of two fixed reversing rollers 8 and one dancer roller 9 are provided between the three plating units 5 as well as before the first and after the last plating unit so as to maintain the correct tension of the foil 4.

Figure 2:
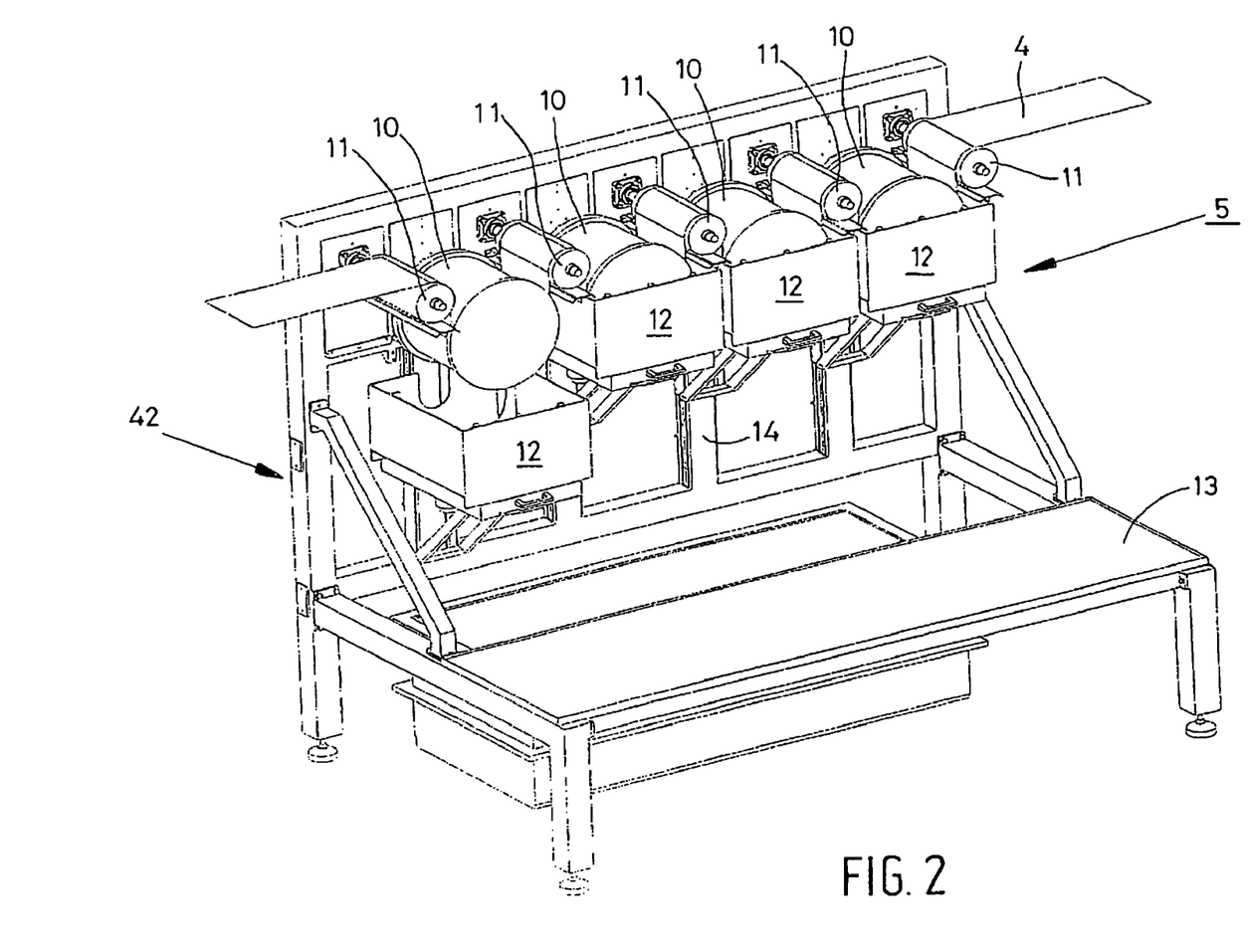
FIG. 2 is a perspective view of a production unit forming part of the production line that is shown in FIG. 1.
Figure 3:
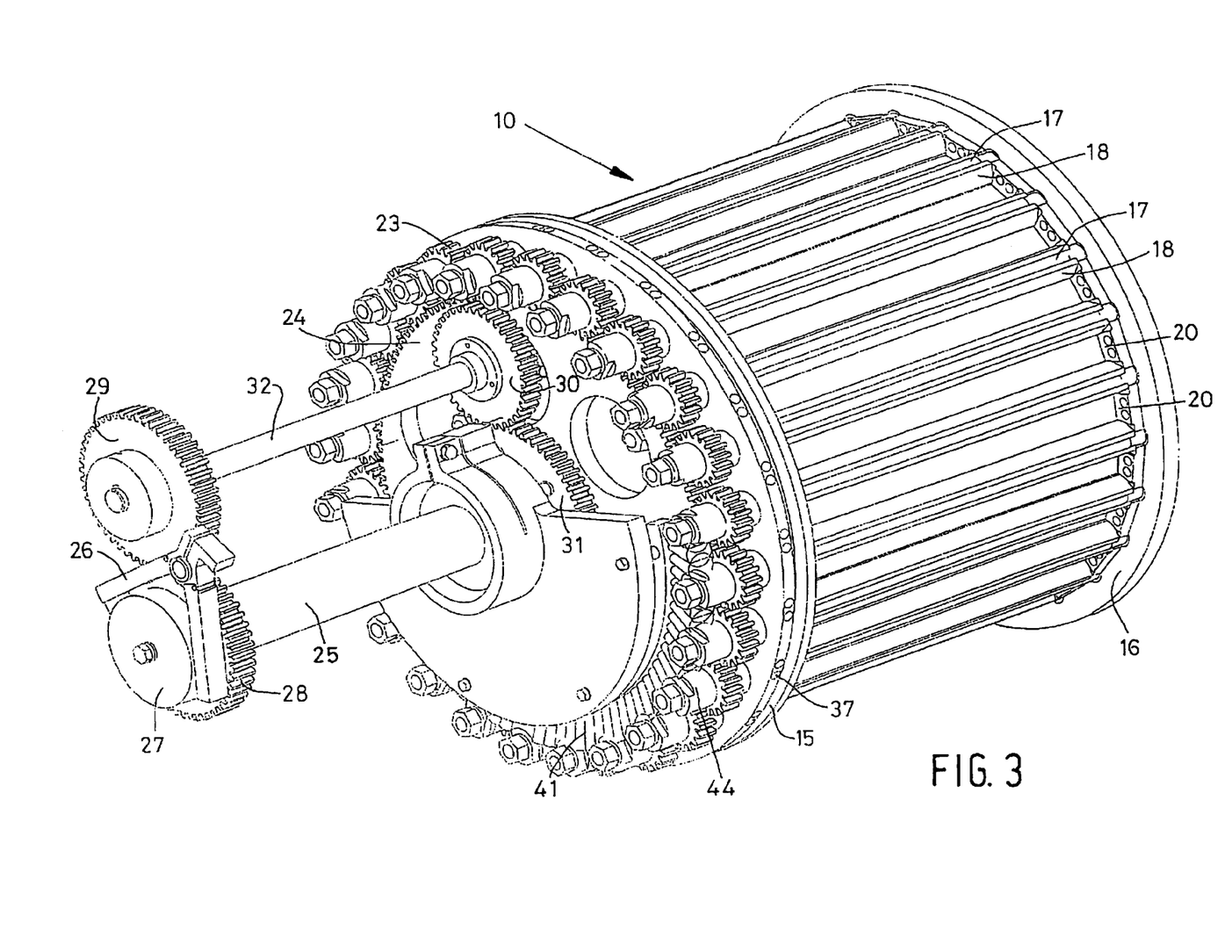
FIG. 3 is a perspective view of an electrode drum.

With further reference to FIG. 2, each plating unit 5 comprises four electrode drums 10, about the lower half of the circumference of which the foil 4 is passed via fixed reversing rollers 11, in such a manner that the electrically conductive pattern thereon faces towards the electrode drum 10. The electrode drums 10 and the fixed reversing rollers 11 are mounted on one side with respect to a framework 42, being rotatable about a horizontal axis of rotation. The framework 42 is provided with four longitudinal guides 14, along which containers 12 are movable between an upper position (see the three right-hand electrode drums 10 in FIG. 2), in which the container 12 substantially surrounds the lower half of the associated electrode drum 10, and a lower position (see the left-hand the electrode drum 10 in FIG. 2), in which the associated electrode drum is completely clear of the container 12. The framework 42 furthermore comprises a platform 13 for persons who can monitor the plating process and/or who must carry out work on the plating unit 5 in question.

FIGS. 3, 4, 6 and 7 are more detailed views of (parts of) an electrode drum 10. The electrode drum the 10 comprises at the outer circumference of parallel, discs 53, 54 two opposed flanged edges 15, 16. Flow passages 37 and 20 are provided in or nearby the flanged edges 15, 16 and discs 53, 54, respectively, viz. two flow passages 20 and two flow passages 37 between two adjacent electrodes 17. A guide groove 49 is provided in the flange 15 for guiding cooperation with the guide ridge 50 in the container 12. Between discs 53, 54, elongated cylindrical electrodes 17 extend in regularly spaced-apart relationship. The electrodes 17 are largely accommodated in bores 21 formed in the outer side of the cross-section of an associated elongated screening element 18. The screening elements 18 are made of a dielectric material, such as a rubber or a plastic. Filtering cloths 19 extend between the screening elements to prevent solid impurities reaching the electrodes 17 and especially the foil 4 from the inside. The screening elements 18 themselves are positioned by means of pins 61. The central axis of the bore 21 is positioned such that an opening is present on the outer side of the screening elements 18, which opening is screened by a limited part of the circumference of the associated electrode 17. This part of the electrode 17 projects just beyond the outer side of the associated screening element 18, so that the inner side of the foil 4 that is passed over the lower half of the electrode drum 10 abuts against with the respective part of the electrode 17 and therefore is in (electrically conducting) contact therewith.

The electrodes 17 are rotatable about their own longitudinal axis. To effect such a rotation in a controlled manner, the electrodes 17 are mechanically connected to gears 23 on the outer side of the flange 15, which gears 23 mesh with the main gear 24. The main gear 24 is rigidly coupled with the gear 31, with the main gear 24 and the gear 31 being freely rotatable about the drive shaft is 25. The drive shaft 25 is rigidly coupled with the electrode drum 10 for rotation thereof about its horizontal central axis. The rotation of the main gear 24 relative to the electrode drum 10 and thus of the gears 23 relative to the electrode drum 10 takes place via the transmission formed by the meshing gears 28, 29 and the meshing gears 30, 31, with the gears 29 and 30 being rigidly coupled via the connecting shaft 32. As a result of the transmission arrangement as described above, rotation of the various electrodes 17 about their own central axis takes place during rotation of the electrode drum 10. As a result, the electrodes can roll on the side of the foil that faces towards the electrode drum, as it were, during the time that the foil abuts against the lower part of the electrode drum 10. Said rolling can take place in a comparatively very slow manner. This is clearly illustrated in FIGS. 5a-5c.

Figures 4, 5A, 5B, 5C:
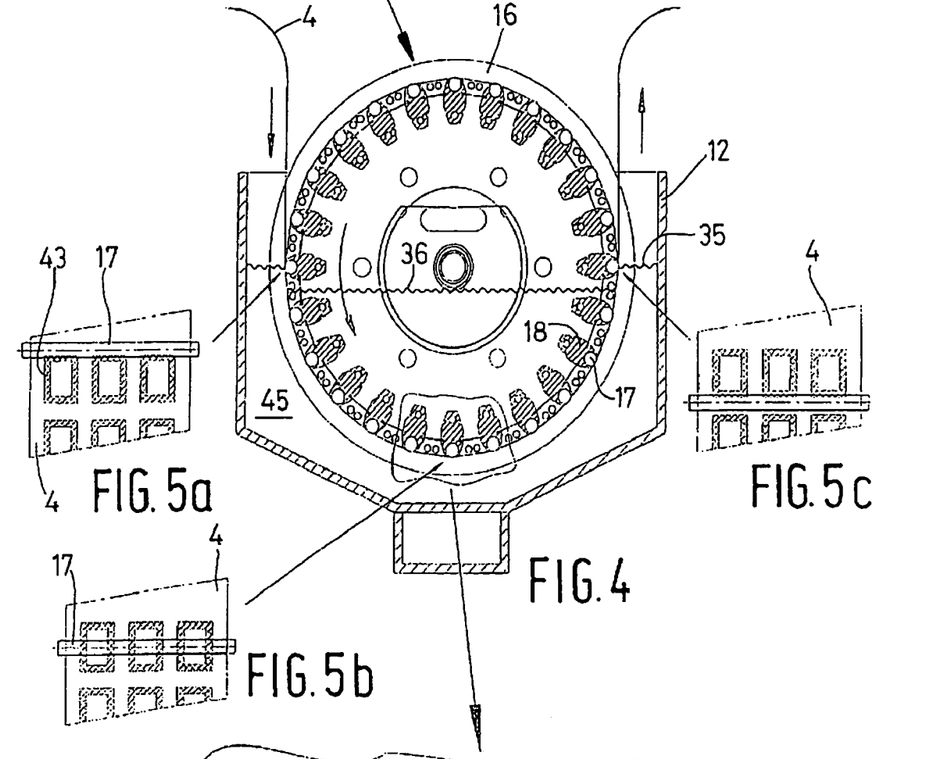
FIG. 4 is a vertical sectional view of the electrode drum that is shown in FIG. 3.
FIGS. 5a, 5b and 5c are radial views, showing three successive positions of a substrate path at the positions indicated by arrows in FIG. 4.

FIGS. 5a-5c show successive situations for a specific piece of foil 4. Present on said foil are patterns 43 of an electrically conductive material, such as copper, which patterns may be spiral-shaped, for example, for use as a planar antenna for an RFID label. FIG. 1 of WO 02/096168 shows two examples of such spiral shapes. FIG. 5a shows the manner in which the-electrode 17 is positioned on one side of a row of three such patterns 43. During the movement of this part of the foil 4 jointly with the electrode drum 10 at the lower half of the circumference thereof, the electrode 17 rolls on the foil 4 over a distance equal to the pitch distance between the rows of three patterns 43. Consequently, the electrode 17 is positioned in the centre of the row of three patterns 43 in the lower position that is shown in FIG. 5b, whilst in the position that is shown in FIG. 5c the electrode 17 is positioned just beyond said row of three patterns 43. The mechanical load that the pattern 43 experiences as a result of the contacting relative movement of the electrode 17 along the surface thereof is minimal, precisely because of the low relative speed and because of the fact that said contact is a rolling contact.

Figure 7:
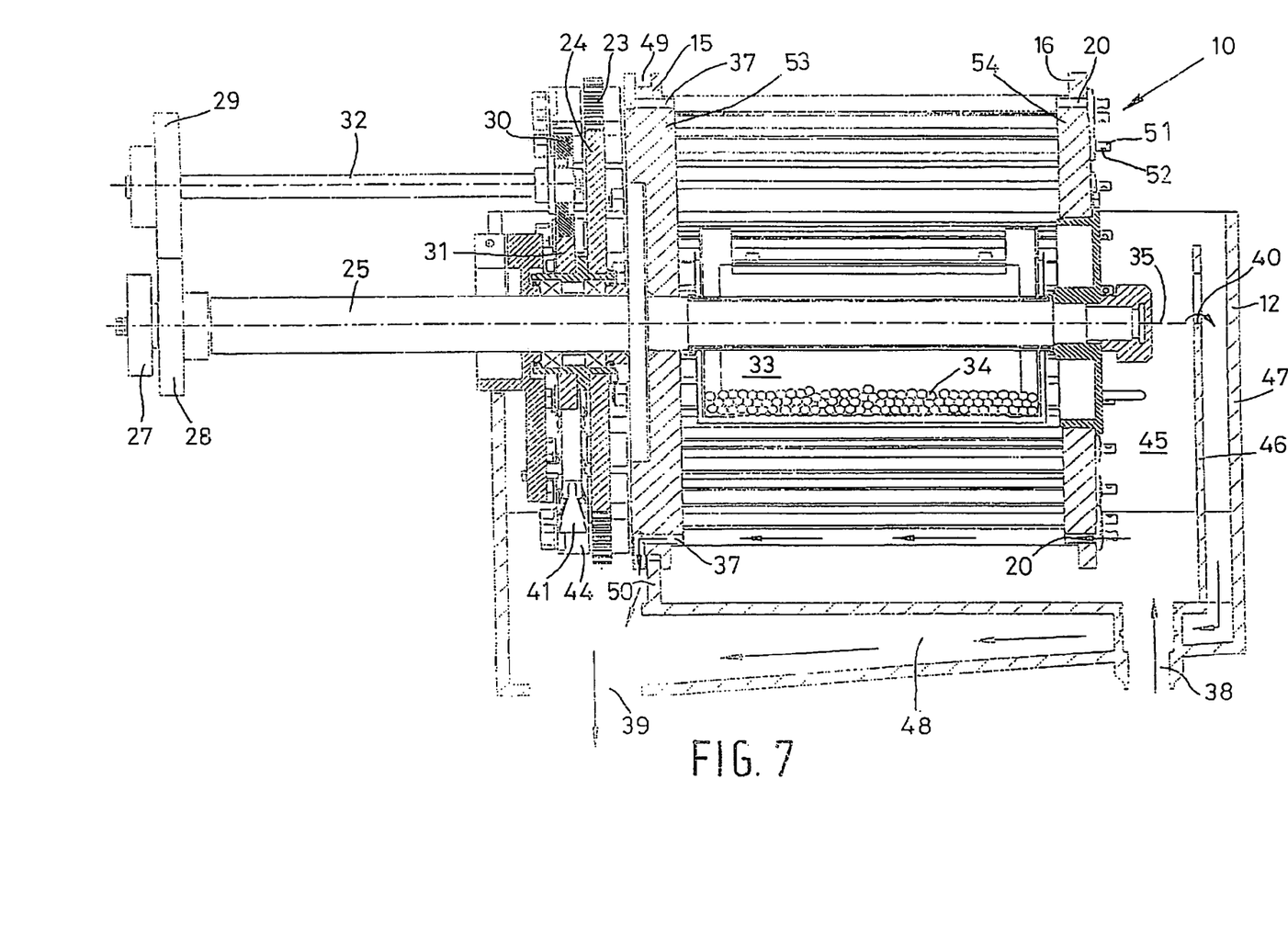
FIG. 7 is a vertical longitudinal sectional view of the electrode drum of FIG. 3.

A basket 33 is provided in the interior of the electrode drum 10 for accommodating balls 34 of an anodic material. The anodic material may also be provided in another form, for example as one solid block or as a number of smaller blocks. A positive electric voltage is applied to the basket 33 with the balls 34 present therein by means of the terminal 26, which engages the contact disc 27, which is rigidly connected to the drive shaft 25. The terminal 26 is to that end connected to the positive side of a rectifier. A semicircular brush 41 is provided on the outer side of the flange 15. Said brush 41, which does not rotate along with the electrode drum 10, is in electrically conducting contact with a shaft portion 44, which shaft portion 44 is in turn in electrically conducting contact with the associated electrode 17. The brush 41 is connected to the negative side of the rectifier (not shown).

In use, the container 12 is filled with an electrolytic salt solution 45. The material of the anodic balls 35 will dissolve in said salt solution 45 as ions, for example copper ions, and will be attracted by the cathodes formed by the electrodes 17 and the patterns 43 that are in electrical contact therewith. Since the electrodes 17 are screened practically entirely either by the screening element 18 or by the foil 4, the actual precipitation of the ions will take place on the electrically conductive patterns 43 insofar as they are not covered by the electrodes 17 and insofar as they are present in the electrolytic salt solution 45. Thus, the layer thickness of the patterns 43 can be increased electrolytically in a continuous manner until the desired layer thickness has been obtained. To increase the layer thickness, it is possible, for example, to either decrease the speed of the movement of the foil 4 through the electrolytic salt solution 45 or increase the number of plating units 5 and/or the number of electrode drums 10 of each plating unit 5. The general rule is that the longer the foil 4 stays in the salt solution 45, the greater the layer thickness of the patterns 43 will be. It will be apparent to those skilled in the art that because of the direct contact that takes place between the electrodes 17 and the patterns 43, various parts, such as windings in the case of spiral-shaped patterns, may be in contact with the electrode 17 simultaneously, as a result of which a high electrical resistance of the electrically conductive pattern 43 that may occur will not lead to substantial differences in thickness between the various parts of the patterns 43.

FIG. 7 shows how the electrolytic salt solution 45 is circulated by pumping means (not shown). The salt solution 45 enters the container 12 via the inlet 38 at the bottom side of the container 12. The container 12 is filled to the liquid level 35, which is equal to the level of the overflow edge 40 of the vertical partition 46 in the container 12. Insofar as salt solution 45 flows over the overflow edge 40, this part of the salt solution 45 exceeds the container 12 via the space between the partition 46 and the front wall 47 of the container 12 and the outflow channel 48 at the bottom side of the container 12. The salt solution 45 flows into the space between the flanges 15, 16 and the inner side of the foil 4 via the passages 20. The salt solution 45 exits said space again via the passages 37 in the flange 15. Subsequently, the salt solution 45 exits the container 12 again via the outlet 39. In this way "fresh" electrolytic salt solution 45 is continuously supplied to the direct surroundings of the patterns 43. The liquid level 36 of the electrolytic salt solution 45 within said space is slightly lower than the liquid level 35 outside said space, because of the relatively narrow passageway from the passage 20 to the passage 37, which leads to a liquid pressure being exerted on the outer side of the foil 4 in the direction of the electrodes 17, so that a good contact between the electrodes 17 and the inner side of the foil 4 is obtained.

Figure 6:
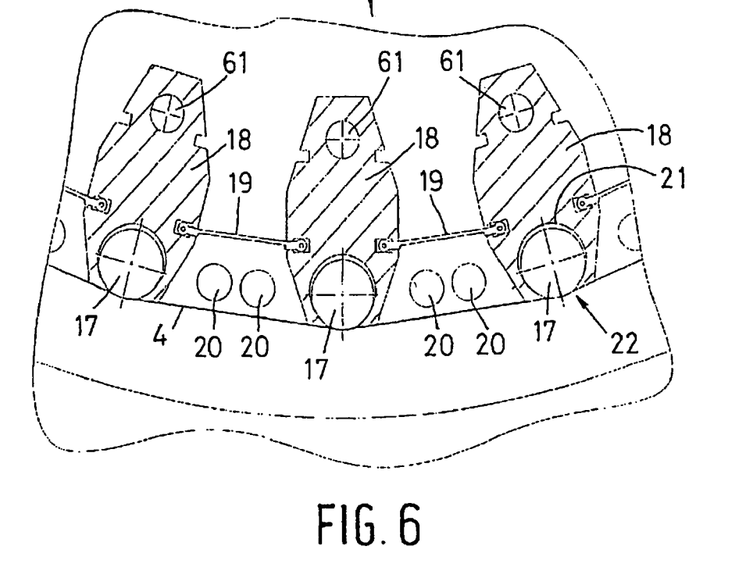
FIG. 6 shows the detail area indicated in FIG. 4.

As is clearly shown in FIGS. 4 and 6, the electrode drum 10 extends partially, more specifically over about half its height, above the salt solution 45. An important advantage of this is the fact that the electrodes 17 that are present above the salt solution 45 will not be troubled by the deposition of metal ions thereon, in spite of the absence of contact with the foil 4. This in contrast to the situation in which the electrode drum would be fully immersed in the salt solution. Another important advantage is the fact that in principle it is possible to exchange the electrodes 17 for another electrode as soon as they are present above the salt solution without having to interrupt the production process. To that end each electrode 17 is provided with an engagement portion of 51 on its side remote from the gear system, which engagement portion is insulated from the associated electrode 17, and with a radial bore 52 through which a pin can be passed for unscrewing the electrodes 17 from disc 53, after which the electrode 17 in question can be pulled in longitudinal direction from the associated bore 21 and be exchanged for another electrode 17, which is subsequently screwed down in disc 53 again.

The scope of the present invention is not limited to the preferred embodiment as described above, it is rather defined by the appended claims. It is explicitly noted that, for example as a variant to be preferred embodiment as described above, also a situation in which the substrate is vertically oriented in the electrolytic bath during electrical contact with a negatively charged electrode, can fall within the scope of the present invention. In addition to that it is explicitly noted that also that situation in which the contact between the substrate and the electrode takes place during a rectilinear movement of the substrate through the electrolytic bath can fall within the scope of the present invention.

The invention claimed is:

1. A device for electrolytically increasing the thickness of an electrically conductive pattern on a dielectric substrate, comprising:
  a container for an electrolytic bath;
  first positioning means for positioning the substrate with the pattern present thereon in the bath;
  a negatively charged electrode for electrically conducting contact with the pattern, wherein the electrode is largely accommodated in a cavity of a screening element, extends outside the screening element to a limited extent, and is rotatable within the cavity of the screening element;
  second positioning means for positioning the electrode in such a manner that the electrode is in conducting contact in the bath with the pattern; and
  moving means for effecting contacting movement of the electrode and the pattern on the substrate with respect to each other to make moving contact with the pattern on the substrate.

2. A device according to claim 1, wherein the first positioning means comprise first moving means for moving the substrate with the pattern present thereon into the bath, through the bath and out of the bath according to a path of movement.

3. A device according to claim 1 or 2, wherein the second positioning means comprise second moving means for moving the electrode at least through the bath.

4. A device according to claim 3, wherein the second moving means are arranged for moving the electrode according to at least part of the path of movement.

5. A device according to claim 1, wherein the electrode has the shape of a cylinder and is rotatable about the central axis thereof.

6. A device according to claim 2, wherein the first moving means comprise a circumferential element for passing the substrate with the pattern present thereon over at least part of the circumference of the circumferential element.

7. A device according to claim 6, wherein a number of elongated electrodes are arranged along the circumference of the circumferential element, the longitudinal directions of which electrodes extend at least substantially parallel to each other, perpendicularly to the path of movement.

8. A device according to claim 7, wherein the electrodes are positioned on the inner side of the path of movement.

9. A device according to claim 6, wherein the circumferential element is provided with two annular flanged edges, between which the path of movement extends.

10. A device according to claim 6, wherein the circumferential element is made up of a first rotary element, which is rotatable about at least one first axis of rotation.

11. A device according to claim 3, wherein
the second moving means comprise a second rotary element, which is rotatable about at least one second axis of rotation, along the circumference of which second rotary element a number of elongated electrodes are provided, the longitudinal directions of which electrodes extend at least substantially parallel to each other.

12. A device according to claim 11, wherein the first rotary element and the second rotary element are formed by a common rotary element.

13. A device according to claim 11, wherein the electrodes have the shape of a cylinder, and wherein the electrodes are rotatable about the respective central axes thereof with respect to the remaining part of the second rotary element.

14. A device according to claim 11, wherein the first rotary element and/or the second rotary element at least substantially have the shape of a cylinder, about the central axis of which the first rotary element and/or the second rotary element are rotatable.

15. A device according to claim 11, wherein transmission means are provided for rotation of the electrodes about the central axes thereof on the one hand and of the second rotary element about the second axis of rotation on the other hand according to a specific transmission ratio.

16. A device for electrolytically increasing the thickness of an electrically conductive pattern on a dielectric substrate, comprising:

a container for an electrolytic bath;

first positioning means for positioning the substrate with the pattern present thereon in the bath;

a negatively charged electrode for electrically conducting contact with the pattern, wherein the electrode is rotatable about its own longitudinal axis; and second positioning means for positioning the electrode in such a manner that the electrode is in conducting contact in the bath with the pattern, wherein said first positioning means comprise first moving means for moving the substrate with the pattern present thereon into the bath, through the bath and out of the bath according to a path of movement, and wherein said first moving means comprise a circumferential element for passing the substrate with the pattern present thereon over at least part of the circumference of the circumferential element to make moving contact with the pattern on the substrate, a number of elongated electrodes being arranged along the circumference of the circumferential element, the longitudinal directions of which electrodes extend at least substantially parallel to each other, perpendicularly to the path of movement, said circumferential element being provided with two ring-shaped flanged edges, between which said path of movement extends.

17. An apparatus according to claim 1, wherein said electrode is configured for movement partly in the electrolytic bath and partly above the electrolytic bath.

18. A apparatus according to claim 1, wherein said container is configured to have a higher liquid level created in the electrolytic bath on the side of the substrate facing away from the electrode than on the side of the substrate facing towards the electrode.

* * * * *